US012696656B2

(12) United States Patent
Hu et al.

(10) Patent No.: US 12,696,656 B2
(45) Date of Patent: Jul. 28, 2026

(54) DISPLAY PANEL AND DISPLAY PANEL MANUFACTURING METHOD

(71) Applicant: SHENZHEN CHINA STAR OPTOELECTRONICS SEMICONDUCTOR DISPLAY TECHNOLOGY CO., LTD., Shenzhen (CN)

(72) Inventors: Jingyuan Hu, Shenzhen (CN); Fanjing Wu, Shenzhen (CN)

(73) Assignee: SHENZHEN CHINA STAR OPTOELECTRONICS SEMICONDUCTOR DISPLAY TECHNOLOGY CO., LTD., Shenzhen (CN)

( * ) Notice: Subject to any disclaimer, the term of this patent is extended or adjusted under 35 U.S.C. 154(b) by 373 days.

(21) Appl. No.: 18/395,950

(22) Filed: Dec. 26, 2023

(65) Prior Publication Data

US 2024/0397788 A1     Nov. 28, 2024

(30) Foreign Application Priority Data

May 26, 2023    (CN) .......................... 202310610204.6

(51) Int. Cl.
*H10K 59/80*      (2023.01)
*H10K 59/12*      (2023.01)
*H10K 59/122*     (2023.01)
*H10K 59/131*     (2023.01)

(52) U.S. Cl.
CPC ... *H10K 59/80522* (2023.02); *H10K 59/1201* (2023.02); *H10K 59/122* (2023.02); *H10K 59/131* (2023.02)

(58) Field of Classification Search
CPC ........ H10K 59/122–124; H10K 59/131–1315; H10K 59/8051–80517; H10K 59/8052–80523; H10K 59/80517
See application file for complete search history.

(56) References Cited

U.S. PATENT DOCUMENTS

2020/0135819 A1*   4/2020   Kim ..................... H10K 71/231
2022/0181399 A1*   6/2022   Shim ................... H10K 59/122
2025/0098416 A1*   3/2025   Yuan .................. H10K 59/1213

FOREIGN PATENT DOCUMENTS

CN      115117130 A   *   9/2022     ........... H10K 59/123

* cited by examiner

*Primary Examiner* — Evan G Clinton
(74) *Attorney, Agent, or Firm* — The Roy Gross Law Firm, LLC; Roy D. Gross

(57) ABSTRACT

The present application provides a display panel and a display panel manufacturing method disposing a stacked second auxiliary electrode such that the second auxiliary electrode forms a cutout structure. A first aperture is defined in a location of the pixel definition layer corresponding to the second auxiliary electrode. The first aperture exposes at least one portion of the cutout structure of the second auxiliary electrode, the organic light emitting layer is disconnected at the at least one portion of the cutout structure exposed by the first aperture to expose at least one portion of the sidewall of the second auxiliary electrode. A cathode layer is electrically connected to the at least one portion of the sidewall of the second auxiliary electrode exposed by the organic light emitting layer such that the cathode layer can directly contact and be electrically connected to a sidewall of the second auxiliary electrode.

18 Claims, 8 Drawing Sheets

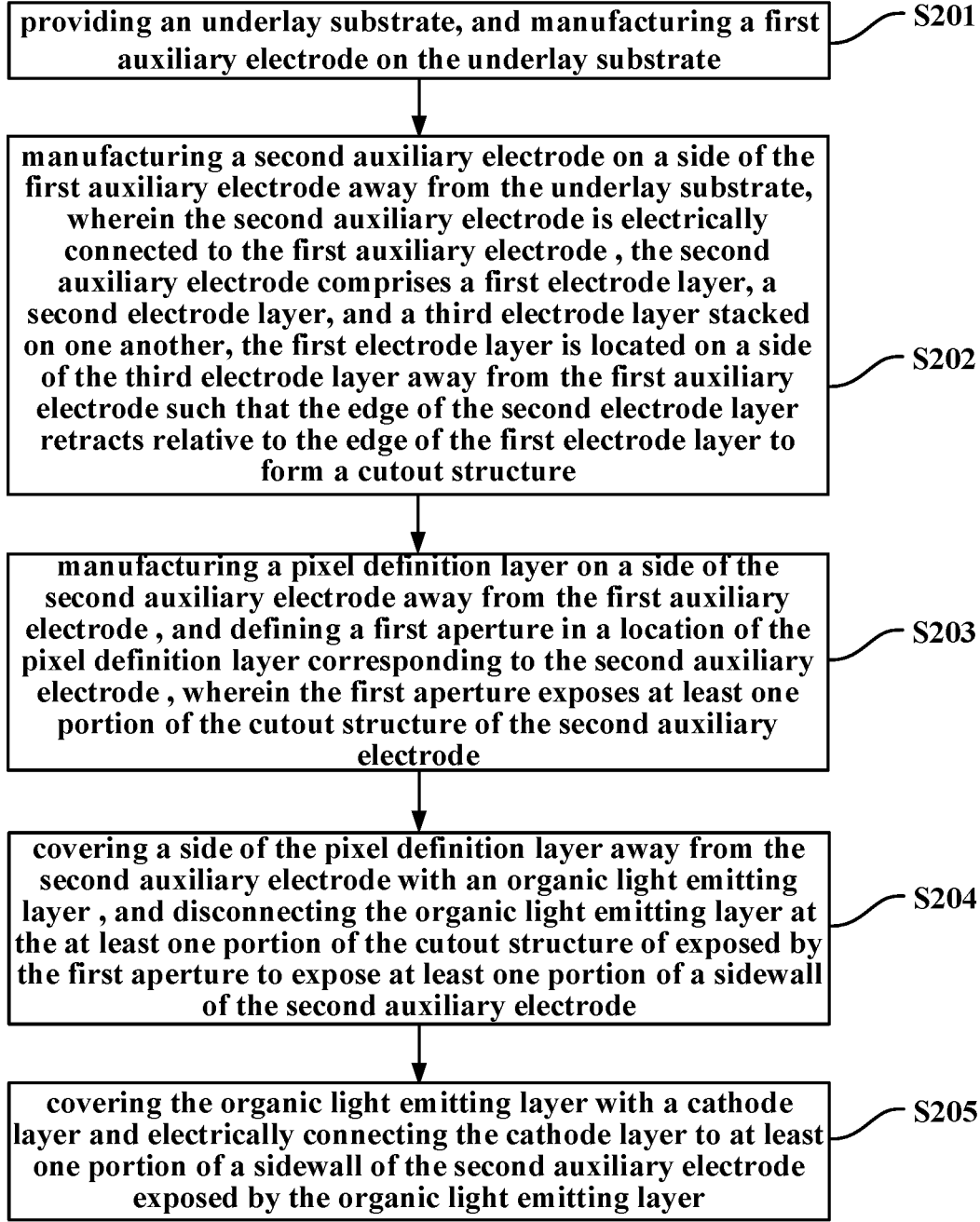

providing an underlay substrate, and manufacturing a first auxiliary electrode on the underlay substrate — S201 manufacturing a second auxiliary electrode on a side of the first auxiliary electrode away from the underlay substrate, wherein the second auxiliary electrode is electrically connected to the first auxiliary electrode , the second auxiliary electrode comprises a first electrode layer, a second electrode layer, and a third electrode layer stacked on one another, the first electrode layer is located on a side of the third electrode layer away from the first auxiliary electrode such that the edge of the second electrode layer retracts relative to the edge of the first electrode layer to form a cutout structure — S202 manufacturing a pixel definition layer on a side of the second auxiliary electrode away from the first auxiliary electrode , and defining a first aperture in a location of the pixel definition layer corresponding to the second auxiliary electrode , wherein the first aperture exposes at least one portion of the cutout structure of the second auxiliary electrode — S203 covering a side of the pixel definition layer away from the second auxiliary electrode with an organic light emitting layer , and disconnecting the organic light emitting layer at the at least one portion of the cutout structure of exposed by the first aperture to expose at least one portion of a sidewall of the second auxiliary electrode — S204 covering the organic light emitting layer with a cathode layer and electrically connecting the cathode layer to at least one portion of a sidewall of the second auxiliary electrode exposed by the organic light emitting layer — S205

FIG. 4

DISPLAY PANEL AND DISPLAY PANEL MANUFACTURING METHOD

CROSS REFERENCE TO RELATED APPLICATIONS

This application claims the priority to Chinese Patent Application No. 202310610204.6, filed on May 26, 2023. The entire disclosures of the above application are incorporated herein by reference.

FIELD OF INVENTION

The present application relates to a field of display technologies, especially to a display panel and a display panel manufacturing method.

BACKGROUND OF INVENTION

A structure of a top-emission large-size organic light-emitting (OLED) display panel includes a transparent anode layer, a light-emitting layer, and a metal cathode layer. To increase the transmittance of the top-emission display panel, the thickness of the metal cathode layer can be made thinner. However, doing so can result in a higher sheet resistance of the metal cathode layer, leading to a severe current-voltage drop (IR-drop) and causing noticeable uneven brightness in the OLED display panel. This significantly affects the display effect of the OLED display panel.

To mitigate the issue of uneven display brightness in the OLED display panel, an auxiliary electrode can be connected in parallel with the metal cathode layer to reduce the resistance of the metal cathode layer. Since the resistance of the auxiliary electrode is smaller, the current-voltage drop decreases. When powered on, the impedance and current-voltage drop of the metal cathode layer in the display panel decrease, leading to a certain improvement in brightness uniformity. For the implementation of the connection between the auxiliary electrode and the metal cathode layer, it is common to use trapezoidal spacer columns placed between the metal cathode layer and the auxiliary electrode. However, spacer columns have a large volume, affecting aperture rate and encapsulation. Moreover, the selection of raw materials is limited, making the manufacturing process more complex and reducing the production rate.

SUMMARY OF INVENTION

The present application provides a display panel and a display panel manufacturing method to mitigate a technical issue of a conventional organic light emitting (OLED) display panel required to manufacture a spacer column to mitigate an IR-drop of the metal cathode layer and resulting complicated processes.

To solve the above issue, the present application provides a technical solution as follows:

The embodiment of the present application provides a display panel, comprising:

an underlay substrate;

a first auxiliary electrode disposed on the underlay substrate;

a second auxiliary electrode disposed on a side of the first auxiliary electrode away from the underlay substrate and electrically connected to the first auxiliary electrode, wherein the second auxiliary electrode comprises a first electrode layer, a second electrode layer, and a third electrode layer stacked on one another, the first electrode layer is located on a side of the third electrode layer away from the first auxiliary electrode, an edge of the second electrode layer retracts relative to an edge of the first electrode layer to form a cutout structure;

a pixel definition layer disposed on a side of the second auxiliary electrode away from the first auxiliary electrode, wherein a first aperture is defined in a location of the pixel definition layer corresponding to the second auxiliary electrode, and the first aperture exposes at least one portion of the cutout structure of the second auxiliary electrode;

an organic light emitting layer covering a side of the pixel definition layer away from the second auxiliary electrode and disconnected on the at least one portion of the cutout structure exposed by the first aperture to expose at least one portion of a sidewall of the second auxiliary electrode; and a cathode layer covering the organic light emitting layer and electrically connected to the at least one portion of the sidewall of the second auxiliary electrode exposed by the organic light emitting layer.

In the display panel provided by the embodiment of the present application, a thickness of the first electrode layer is greater than a thickness of the third electrode layer, and the thickness of the first electrode layer ranges from 500 Å to 1000 Å.

In the display panel provided by the embodiment of the present application, material of the first electrode layer is the same as material of the third electrode layer, and the material of the first electrode layer is different from material of the second electrode layer.

In the display panel provided by the embodiment of the present application, the material of the first electrode layer comprises at least one of IZO, ITO, IGZO, and WOx, and the material of the second electrode layer comprises at least one of Ag alloy and Al alloy.

In the display panel provided by the embodiment of the present application, the display panel further comprises a planarization layer covering the first auxiliary electrode and an anode disposed on the planarization layer, the organic light emitting layer is located between the anode and the cathode layer, and the anode and the second auxiliary electrode are disposed in a same layer.

In the display panel provided by the embodiment of the present application, a first via hole is defined in a location of the planarization layer corresponding to the first auxiliary electrode location, the first via hole exposes a portion of the first auxiliary electrode, the second auxiliary electrode is located on the planarization layer and in the first via hole, and the second auxiliary electrode is electrically connected to the first auxiliary electrode via a portion of the second auxiliary electrode located in the first via hole.

In the display panel provided by the embodiment of the present application, a second aperture is defined in a location of the planarization layer corresponding to the first auxiliary electrode, the second aperture is disposed to correspond to the first aperture and communicates with the first aperture, the second aperture exposes a portion of the first auxiliary electrode; the second auxiliary electrode is located on the first auxiliary electrode in the second aperture, and is electrically connected to the first auxiliary electrode.

In the display panel provided by the embodiment of the present application, the display panel further comprises a transistor disposed on the underlay substrate, the anode is located on a side of the transistor away from the underlay substrate, and the anode is electrically connected to the transistor; the transistor comprises an active layer, a gate electrode, a source electrode, and a drain electrode, and the first auxiliary electrode and the source electrode are disposed in a same layer.

In the display panel provided by the embodiment of the present application, an edge of the third electrode layer retracts relative to the edge of the second electrode layer to form a second cutout structure.

The embodiment of the present application further provides a display panel, comprising:

an underlay substrate;

a first auxiliary electrode disposed on the underlay substrate;

a second auxiliary electrode disposed on a side of the first auxiliary electrode away from the underlay substrate and electrically connected to the first auxiliary electrode, wherein the second auxiliary electrode comprises a first electrode layer, a second electrode layer, and a third electrode layer stacked on one another, the first electrode layer is located on a side of the third electrode layer away from the first auxiliary electrode, an edge of the second electrode layer retracts relative to an edge of the first electrode layer to form a cutout structure;

a pixel definition layer disposed on a side of the second auxiliary electrode away from the first auxiliary electrode, wherein a first aperture is defined in a location of the pixel definition layer corresponding to the second auxiliary electrode, and the first aperture exposes at least one portion of the cutout structure of the second auxiliary electrode;

an organic light emitting layer covering a side of the pixel definition layer away from the second auxiliary electrode and disconnected on the at least one portion of the cutout structure exposed by the first aperture to expose at least one portion of a sidewall of the second auxiliary electrode;

a cathode layer covering the organic light emitting layer and electrically connected to the at least one portion of the sidewall of the second auxiliary electrode exposed by the organic light emitting layer; and a planarization layer covering the first auxiliary electrode and an anode disposed on the planarization layer, wherein the organic light emitting layer is located between the anode and the cathode layer, and the anode and the second auxiliary electrode are disposed in a same layer;

wherein an edge of the third electrode layer retracts relative to the edge of the second electrode layer to form a second cutout structure.

In the display panel provided by the embodiment of the present application, a thickness of the first electrode layer is greater than a thickness of the third electrode layer, and the thickness of the first electrode layer ranges from 500 Å to 1000 Å.

In the display panel provided by the embodiment of the present application, material of the first electrode layer is the same as material of the third electrode layer, and the material of the first electrode layer is different from material of the second electrode layer.

In the display panel provided by the embodiment of the present application, the material of the first electrode layer comprises at least one of IZO, ITO, IGZO, and WOx, and the material of the second electrode layer comprises at least one of Ag alloy and Al alloy.

In the display panel provided by the embodiment of the present application, a first via hole is defined in a location of the planarization layer corresponding to the first auxiliary electrode location, the first via hole exposes a portion of the first auxiliary electrode, the second auxiliary electrode is located on the planarization layer and in the first via hole, and the second auxiliary electrode is electrically connected to the first auxiliary electrode via a portion of the second auxiliary electrode located in the first via hole.

In the display panel provided by the embodiment of the present application, a second aperture is defined in a location of the planarization layer corresponding to the first auxiliary electrode, the second aperture is disposed to correspond to the first aperture and communicates with the first aperture, the second aperture exposes a portion of the first auxiliary electrode; the second auxiliary electrode is located on the first auxiliary electrode in the second aperture, and is electrically connected to the first auxiliary electrode.

In the display panel provided by the embodiment of the present application, the display panel comprises a transistor disposed on the underlay substrate, the anode is located on a side of the transistor away from the underlay substrate, and the anode is electrically connected to the transistor; the transistor comprises an active layer, a gate electrode, a source electrode, and a drain electrode, and the first auxiliary electrode and the source electrode are disposed in a same layer.

The embodiment of the present application further provides a display panel manufacturing method, comprising:

providing an underlay substrate, and manufacturing a first auxiliary electrode on the underlay substrate;

manufacturing a second auxiliary electrode on a side of the first auxiliary electrode away from the underlay substrate, wherein the second auxiliary electrode is electrically connected to the first auxiliary electrode, the second auxiliary electrode comprises a first electrode layer, a second electrode layer, and a third electrode layer stacked on one another, the first electrode layer is located on a side of the third electrode layer away from the first auxiliary electrode, and making an edge of the second electrode layer retracting relative to an edge of the first electrode layer to form a cutout structure;

manufacturing a pixel definition layer on a side of the second auxiliary electrode away from the first auxiliary electrode, and forming a first aperture in a location of the pixel definition layer corresponding to the second auxiliary electrode, wherein the first aperture exposes at least one portion of the cutout structure of the second auxiliary electrode;

covering a side of the pixel definition layer away from the second auxiliary electrode with an organic light emitting layer, and disconnecting the organic light emitting layer at the at least one portion of the cutout structure exposed by the first aperture to expose at least one portion of a sidewall of the second auxiliary electrode; and covering the organic light emitting layer with a cathode layer, and electrically connecting the cathode layer to the at least one portion of the sidewall of the second auxiliary electrode exposed by the organic light emitting layer.

In the display panel manufacturing method provided by the embodiment of the present application, the step of making an edge of the second electrode layer retracting relative to an edge of the first electrode layer to form a cutout structure comprises:

etching the second auxiliary electrode by Ag acid, by controlling an etching time and an etching apparatus parameter of the Ag acid, and making an edge of the second electrode layer retract relative to an edge of the first electrode layer to form a cutout structure.

In the display panel manufacturing method provided by the embodiment of the present application, the step of manufacturing a second auxiliary electrode on a side of the first auxiliary electrode away from the underlay substrate further comprises: making an edge of the third electrode layer retract relative to the edge of the second electrode layer to form a second cutout structure.

Advantages of the present application: In the display panel and the display panel manufacturing method provided by the present application, the stacked second auxiliary electrode is used, and the second auxiliary electrode forms a cutout structure. A first aperture is defined in a location of the pixel definition layer corresponding to the second auxiliary electrode. The first aperture exposes at least one portion of the cutout structure of the second auxiliary electrode, the organic light emitting layer is disconnected at the at least one portion of the cutout structure exposed by the first aperture to expose at least one portion of the sidewall of the second auxiliary electrode. A cathode layer is electrically connected to the at least one portion of the sidewall of the second auxiliary electrode exposed by the organic light emitting layer such that the cathode layer can directly contact and be electrically connected to a sidewall of the second auxiliary electrode. The cathode layer can be bridged to the second auxiliary electrode without additionally disposing a spacer column to mitigate an IR-drop of the cathode layer, which solves an issue of a conventional OLED display panel required to manufacture a spacer column to mitigate the IR-drop of the metal cathode layer and resulting complicated processes.

DESCRIPTION OF DRAWINGS

To more clearly elaborate on the technical solutions of embodiments of the present invention or prior art, appended figures necessary for describing the embodiments of the present invention or prior art will be briefly introduced as follows. Apparently, the following appended figures are merely some embodiments of the present invention. A person of ordinary skill in the art may also acquire other figures according to the appended figures without any creative effort.

FIG. 4 is a schematic flowchart of the display panel provided by the embodiment of the present application manufacturing method.

DETAILED DESCRIPTION OF PREFERRED EMBODIMENTS

Figure 1:
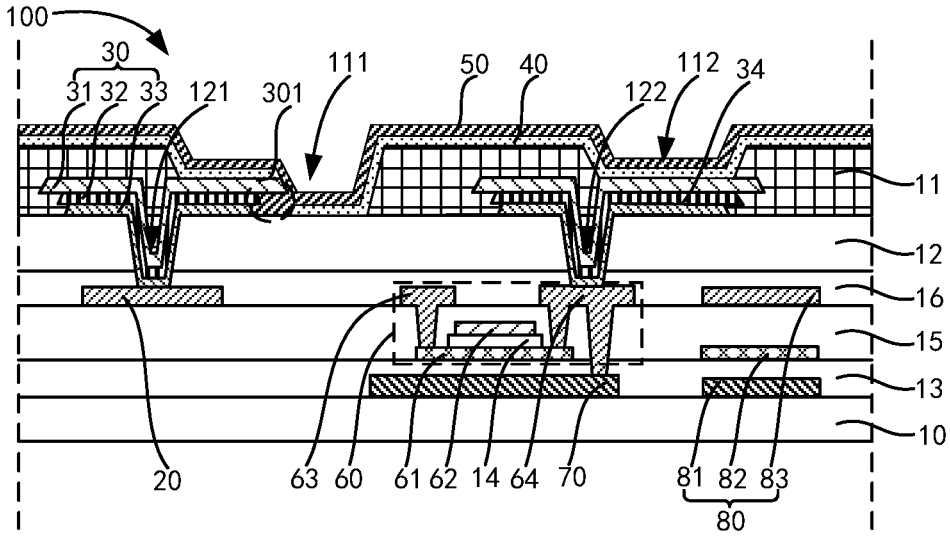
FIG. 1 is a cross-sectional schematic structural view of a display panel provided by the embodiment of the present application.

The explanations of each embodiment below are provided with reference to the accompanying drawings, illustrating specific embodiments that can be implemented in the present application. The directional terms mentioned in the present application, such as [up], [down], [front], [back], [left], [right], [inside], [outside], [side], etc., are only for reference to the directions in the accompanying diagrams. Therefore, the use of directional terms is for the purpose of explaining and understanding the present application, and not to limit the present application. In the figures, units with similar structures are indicated by the same numbers. In the drawings, for clarity and ease of description, the thickness of some layers and regions is exaggerated. That is, the dimensions and thickness of each component shown in the drawings are arbitrarily depicted, but the present application is not limited to them.

Figure 2:
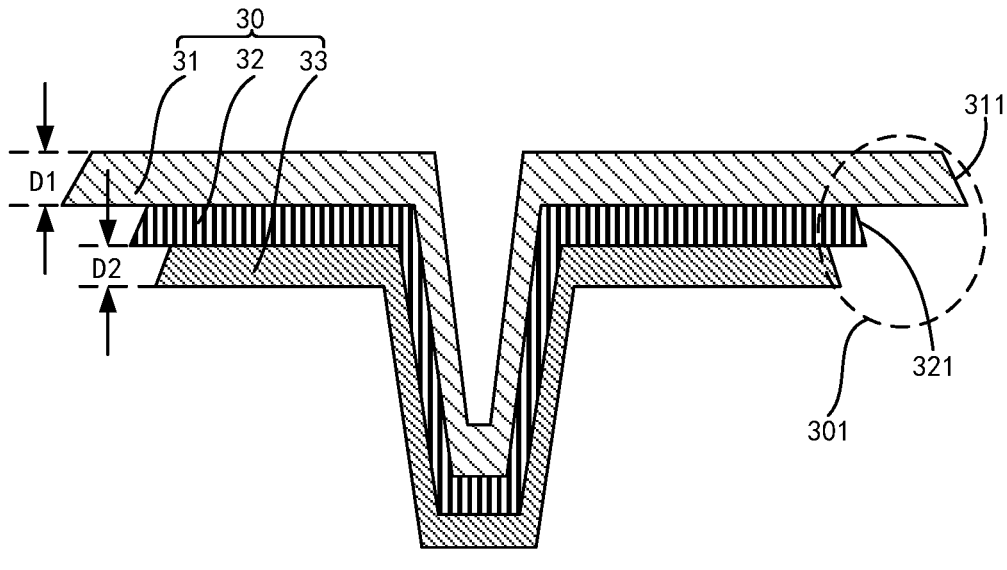
FIG. 2 is a detailed schematic structural view of a first auxiliary electrode provided by the embodiment of the present application.

With reference to FIGS. 1 to 2, FIG. 1 is a cross-sectional schematic structural view of a display panel provided by the embodiment of the present application.

FIG. 2 is a detailed schematic structural view of a first auxiliary electrode provided by the embodiment of the present application. The display panel 100 comprises an underlay substrate 10 and a first auxiliary electrode 20, a second auxiliary electrode 30, an organic light emitting layer 40, and a cathode layer 50 disposed on the underlay substrate 10. The display panel 100 further comprises a pixel definition layer 11 disposed between the second auxiliary electrode 30 and the organic light emitting layer and a planarization layer 12 disposed between the first auxiliary electrode 20 and the second auxiliary electrode 30.

In particular, the first auxiliary electrode 20 is disposed on the underlay substrate 10, and the second auxiliary electrode 30 is disposed on a side of the first auxiliary electrode 20 away from the underlay substrate 10 and is electrically connected to the first auxiliary electrode 20. In more particular, the planarization layer 12 is disposed on the side of the first auxiliary electrode 20 away from the underlay substrate 10. The second auxiliary electrode 30 is disposed on the planarization layer 12 and is electrically connected to the first auxiliary electrode 20.

The second auxiliary electrode 30 comprises a first electrode layer 31, a second electrode layer 32, and a third electrode layer 33 stacked on one another. The first electrode layer 31 is located on a side of the third electrode layer away from the first auxiliary electrode. An edge of the second electrode layer 32 retracts relative to an edge of the first electrode layer 31 to form a cutout structure.

The pixel definition layer 11 is disposed on a side of the second auxiliary electrode away from the first auxiliary electrode. In more particular, the pixel definition layer 11 is disposed on the planarization layer 12, and a first aperture 111 is defined in a location of the pixel definition layer 11 corresponding to the second auxiliary electrode 30. The first aperture 111 exposes at least one portion of the cutout structure of the second auxiliary electrode 30.

In particular, the first aperture 111 of the pixel definition layer 11 partially exposes the cutout structure of the second auxiliary electrode 30. The pixel definition layer 11 also partially covers the second auxiliary electrode 30 such that an orthographic projection of the second auxiliary electrode 30 on the underlay substrate 10 and an orthographic projection of the pixel definition layer 11 on the underlay substrate 10 have an overlap region. Also, the orthographic projection of the second auxiliary electrode 30 on the underlay substrate 10 and the orthographic projection of the pixel definition layer 11 on the underlay substrate 10 have a non-overlap region. Namely, at least some non-overlap region exists in the orthographic projection of the second auxiliary electrode 30 on the underlay substrate 10 and the orthographic projection of the pixel definition layer 11 on the underlay substrate 10.

The organic light emitting layer covers a side of the pixel definition layer away from the second auxiliary electrode. In more particular, the organic light emitting layer 40 covers a side of the pixel definition layer 11 away from the planarization layer 12, and is disconnected at the at least one portion of the cutout structure of the second auxiliary electrode 30 exposed by the first aperture 111 to expose at least one portion of a sidewall of the second auxiliary electrode 30. The cathode layer 50 covers the organic light emitting layer 40 and is electrically connected to the at least one portion of the sidewall of the second auxiliary electrode exposed out of the organic light emitting layer 40. As such, the cathode layer 50 can directly contact and is electrically connected to the sidewall of the second auxiliary electrode 30 such that the cathode layer 50 can be bridged to the second auxiliary electrode 30 without additionally disposing a spacer column to mitigate the voltage drop of the cathode layer 50 to further mitigate uneven display resulting from the voltage drop.

In the present embodiment, the stacked second auxiliary electrode is used, and the second auxiliary electrode forms a cutout structure. A first aperture is defined in a location of the pixel definition layer corresponding to the second auxiliary electrode. The first aperture exposes at least one portion of the cutout structure of the second auxiliary electrode, the organic light emitting layer is disconnected at the at least one portion of the cutout structure exposed by the first aperture to expose at least one portion of the sidewall of the second auxiliary electrode. A cathode layer is electrically connected to the at least one portion of the sidewall of the second auxiliary electrode exposed by the organic light emitting layer such that the cathode layer can directly contact and be electrically connected to a sidewall of the second auxiliary electrode. The cathode layer can be bridged to the second auxiliary electrode without additionally disposing a spacer column to mitigate an IR-drop of the cathode layer, which solves an issue of a conventional OLED display panel required to manufacture a spacer column to mitigate the IR-drop of the metal cathode layer and resulting complicated processes.

A structure of each part of the display panel in the present application and implementation of the cathode layer 50 contacting the sidewall of the second auxiliary electrode 30 will be described specifically as follows.

With further reference to FIG. 1, to achieve light emission of the display panel 100, the display panel 100 further comprises an anode 34 disposed on the planarization layer 12. A third aperture 112 is defined in a location of the pixel definition layer 11 corresponding to the anode 34. The third aperture 112 partially exposes the anode 34. Namely, the pixel definition layer 11 still covers an edge of the anode 34. The organic light emitting layer 40 is located between the anode 34 and the cathode layer 50. The organic light emitting layer 40 emits light under a common effect of the cathode layer 50 and the anode 34.

Optionally, the organic light emitting layer 40 comprises a light emitting unit and a hole transport layer and an electron transport layer located on two sides of the light emitting unit respectively. Of course, the organic light emitting layer 40 can further comprise a hole injection layer and an electron injection layer. The hole injection layer and the hole transport layer are located between the anode 34 and the light emitting unit. The electron injection layer and the electron transport layer are located between the cathode layer 50 and the light emitting unit.

Optionally, the anode 34 and the second auxiliary electrode 30 are disposed in the same layer such that the second auxiliary electrode 30 is located nearer the cathode layer 50 to reduce a contact difficulty between the cathode layer 50 and the second auxiliary electrode 30. "Disposed in the same layer" in the present application refers to that in a manufacturing process, film layers formed by the same material are patterned to obtain at least two different characteristics, then the at least two different characteristics are disposed in the same layer. for instance. The anode 34 and the second auxiliary electrode 30 of the present embodiment are obtained by patterning the same conductive film layer. Then, the anode 34 and the second auxiliary electrode 30 are disposed in the same layer. Namely, the anode 34 is also formed by the stacked first electrode layer 31, second electrode layer 32, and third electrode layer 33.

Material of the first electrode layer 31 is the same as material of the third electrode layer 33, and the material of the first electrode layer 31 is different from material of the second electrode layer 32. The material of the first electrode layer 31 comprises at least one of IZO, ITO, IGZO, and WOx. The material of the second electrode layer 32 comprises at least one of Ag alloy and Al alloy. For instance, the material of the first electrode layer 31 comprises indium zinc oxide (IZO), and the material of the second electrode layer 32 comprises silver (Ag). A thickness D1 of the first electrode layer 31 is greater than a thickness D2 of the third electrode layer 33, as shown in FIG. 2. Optionally, the thickness D1 of the first electrode layer 31 ranges from 500 Å to 1000 Å, the thickness D2 of the third electrode layer 33 ranges from 100 Å to 200 Å, and a thickness of the second electrode layer 32 ranges from 900 Å to 1500 Å.

With further reference to FIG. 2, an edge of the second electrode layer 32 retracts relative to an edge of the first electrode layer 31 to form the cutout structure 301. The cutout structure 301 is an undercut structure, the undercut structure can disconnect the organic light emitting layer 40 at this location. The edge of the second electrode layer 32 refers to a distal end 321 of the second electrode layer 32, namely, an outer outline of the second electrode layer 32. The edge of the first electrode layer 31 refers to a distal end 311 of the first electrode layer 31, namely, an outer outline of the first electrode layer 31.

Furthermore, an edge of the third electrode layer 33 retracts relative to the edge of the second electrode layer 32 to form a second cutout structure to further enlarge a range of the cutout structure 301 to make the organic light emitting layer 40 disconnected at the cutout structure 301 more completely. The edge of the third electrode layer 33 refers to a distal end 321 of the third electrode layer 33, namely, an outer outline of the third electrode layer 33. Also, disposing the third electrode layer 33 can reduce a contact impedance between the first auxiliary electrode 20 and the second electrode layer 32 and prevent an issue of an over direct contact stress between the second electrode layer 32 and the first auxiliary electrode 20. Also, a thickness of the third electrode layer 33 is smaller, when the second auxiliary electrode is etched, because the thickness of the third electrode layer 33 is smaller, the third electrode layer 33 is etched easier to form a retracting shape.

Furthermore, a thickness of the first electrode layer 31 is greater such that a strength of the first electrode layer 31 is greater to have a better support ability, which can guarantee better stability of the formed cutout structure 301 and prevent collapse of a support layer of the cutout structure

301. Also, disposing the first electrode layer 31 with a greater thickness can also increase a light emitting efficiency of the organic light emitting layer 40. For instance, a light emitting efficiency of the organic light emitting layer 40 of a second node can be improved. The second node refers to a selected shape of the organic light emitting layer 40. a film layer thickness of the organic light emitting layer 40 of the second node is thicker, and needs to match the first electrode layer 31 with a greater thickness to increase a cavity length to increase a light emitting efficiency of the organic light emitting layer 40 of the second node.

It can be understood that the organic light emitting layer 40 is usually manufactured in form of an entire surface such that the manufactured organic light emitting layer 40 would cover the pixel definition layer 11 and be formed in the first aperture 111 and the third aperture 112 of the pixel definition layer 11. For instance, the organic light emitting layer 40 covers the anode 34 in the third aperture 112 and the second auxiliary electrode 30 in the first aperture 111. However, the organic light emitting layer 40 covering the second auxiliary electrode 30 would result in the cathode layer 50 almost unable to directly contact the second auxiliary electrode 30.

Therefore, the present embodiment makes the pixel definition layer 11 not covering the edge of the second auxiliary electrode 30 to expose the cutout structure of the second auxiliary electrode 30 to provide a chance for the cathode layer 50 directly contacting the second auxiliary electrode 30.

It can be understood that to guarantee the organic light emitting layer 40 disconnected at the cutout structure of the second auxiliary electrode 30 and exposing a part of the sidewall of the second auxiliary electrode 30, it is required to guarantee an entire thickness of the second auxiliary electrode 30 to be greater than a thickness of the organic light emitting layer. For instance, the thickness of the organic light emitting layer 40 ranges from 100 Å to 500 Å. "Thickness" in the present application refers to a manufacturing thickness of each film layer, for instance, a thickness of the organic light emitting layer 40 refers to a thickness of the manufactured organic light emitting layer 40 covering another film layer.

Of course, the more the thickness of the second auxiliary electrode 30 is greater than the thickness of the organic light emitting layer 40, the more an exposed area of the sidewall of the second auxiliary electrode 30 is when the organic light emitting layer 40 is disconnected at the cutout structure of the second auxiliary electrode 30. As such, a contact area of the cathode layer 50 with the second auxiliary electrode 30 is greater, which more advantages increased reliability of electrical connection of the cathode layer 50 with the second auxiliary electrode 30 and lowers a contact resistance of the cathode layer 50 and the second auxiliary electrode 30.

Furthermore, to guarantee a sufficient space between the second auxiliary electrode 30 and the pixel definition layer 11 to allow the cathode layer 50 to directly contact the second auxiliary electrode 30, an interval distance between the second auxiliary electrode 30 and the pixel definition layer 11 is required to be at least greater than a thickness of the organic light emitting layer 40. Preferentially, the interval distance between the second auxiliary electrode 30 and the pixel definition layer 11 is greater than or equal to a sum of a thickness of the organic light emitting layer 40 and a thickness of the cathode layer 50. As such, a sufficient space is between the pixel definition layer 11 and the second auxiliary electrode 30 layer for the cathode layer 50 directly contacting the sidewall of the second auxiliary electrode 30.

Furthermore, to provide the anode 34 with a driving signal, the display panel 100 further comprises a transistor 60 disposed on the underlay substrate 10. The anode 34 is located on a side of the transistor 60 away from the underlay substrate 10. The anode 34 is electrically connected to the transistor 60.

Optionally, the underlay substrate 10 can be a rigid substrate or a flexible substrate. When the underlay substrate 10 is a rigid substrate, it can comprise a hard substrate such as a glass substrate. When the underlay substrate 10 is a flexible substrate, it can comprise a flexible substrate such as a polyimide (PI) thin film or a super thin glass thin film. Certainly, to enhance the moisture or oxygen resistance of the underlay substrate 10, a buffer layer 13 can be disposed between the underlay substrate 10 and the transistor 60. The buffer layer 13 includes a single layer or multiple layers of materials such as silicon oxide or silicon nitride. The buffer layer 13 serves to prevent the undesired diffusion of impurities or contaminants (such as moisture, oxygen, etc.) from the underlay substrate 10 to the device, which may be susceptible to damage due to these impurities or contaminants. Simultaneously, the buffer layer 13 can also provide a flat top surface.

The transistor 60 is disposed on the underlay substrate 10. The transistor 60 comprises an active layer 61, a gate electrode 62, a source electrode 63, and a drain electrode 64. The anode 34 is electrically connected to the source electrode 63 or the drain electrode 64 of the transistor 60. The embodiment of the present application uses the anode 34 electrically connected to the drain electrode 64 as an example for explanation.

To prevent the active layer 61 of the transistor 60 from light irradiation influencing performance of the transistor 60, the display panel 100 further comprises a light shielding layer 70. The light shielding layer 70 is disposed to correspond to the active layer 61 of the transistor 60 to shield the active layer 61. Also, the light shielding layer 70 is electrically connected to the drain electrode 64 of the transistor 60 to apply a stabilizing voltage to the light shielding layer 70 to prevent the light shielding layer 70 from being in a suspension state causing the non-stable voltage on the light shielding layer 70 to affect electric property of an electric element above the light shielding layer 70 to mitigate a parasitic capacitor.

In particular, the light shielding layer 70 is disposed on the underlay substrate 10. The buffer layer 13 covers the light shielding layer 70 and the underlay substrate 10. The active layer 61 is disposed on the buffer layer 13. A gate electrode insulation layer 14 is disposed on a side of the active layer 61 away from the buffer layer 13. The gate electrode 62 is disposed on the gate electrode insulation layer 14, and the gate electrode 62 is disposed to correspond to a channel of the active layer 61.

An interlayer insulation layer 15 covers the gate electrode 62 and the buffer layer 13. The source electrode 63 and the drain electrode 64 are disposed on the interlayer insulation layer 15. The source electrode 63 is electrically connected to a source region of the active layer 61. The drain electrode 64 is electrically connected to a drain region of the active layer 61. Also, the drain electrode 64 is electrically connected to the light shielding layer 70. The source region and the drain region of the active layer 61 are located on two opposite sides of a channel of the active layer 61. The first auxiliary electrode, the source electrode, and the drain electrode are disposed in the same layer. The source electrode, the drain electrode, and the first auxiliary electrode can be formed by stacked metal layers, for instance, the stacked metal layers comprises molybdenum titanium layer, copper layer, and molybdenum titanium layer that are stacked one another.

A passivation layer 16 covers the source electrode 63, the drain electrode 64, the first auxiliary electrode, and the interlayer insulation layer 15. The planarization layer 12 covers the passivation layer 16. A first via hole 121 is defined in a location of the planarization layer 12 corresponding to the first auxiliary electrode 20, and a second via hole 122 is defined in a location of the planarization layer 12 corresponding to the drain electrode 64. The first via hole 121 exposes a portion of the first auxiliary electrode 20, and the second via hole 122 exposes a portion of the drain electrode 64.

The anode 34 and the second auxiliary electrode 30 are disposed on the planarization layer 12. The anode 34 is electrically connected to the drain electrode 64 via the second via hole 122, the second auxiliary electrode 30 is electrically connected to the first auxiliary electrode 20 via the first via hole 121 to achieve electrical connection of the cathode layer 50 and the first auxiliary electrode 20. By parallel connection of the cathode layer 50 and the first auxiliary electrode 20, a resistance of the cathode layer 50 is reduced, and the voltage drop of the cathode layer 50 is decreased.

Furthermore, the display panel 100 further comprises a storage capacitor 80. The storage capacitor 80 comprises a first electrode plate 81 and a second electrode plate 82 disposed opposite to each other and a third electrode plate 83 to form a triple-layer capacitor structure. The first electrode plate 81 and the light shielding layer 70 are disposed in the same layer. The second electrode plate 82 and the active layer 61 are disposed in the same layer. The third electrode plate 83, the source electrode 63, and the drain electrode 64 are disposed in the same layer. The third electrode plate 83 is electrically connected to the first electrode plate 81.

Figure 3:
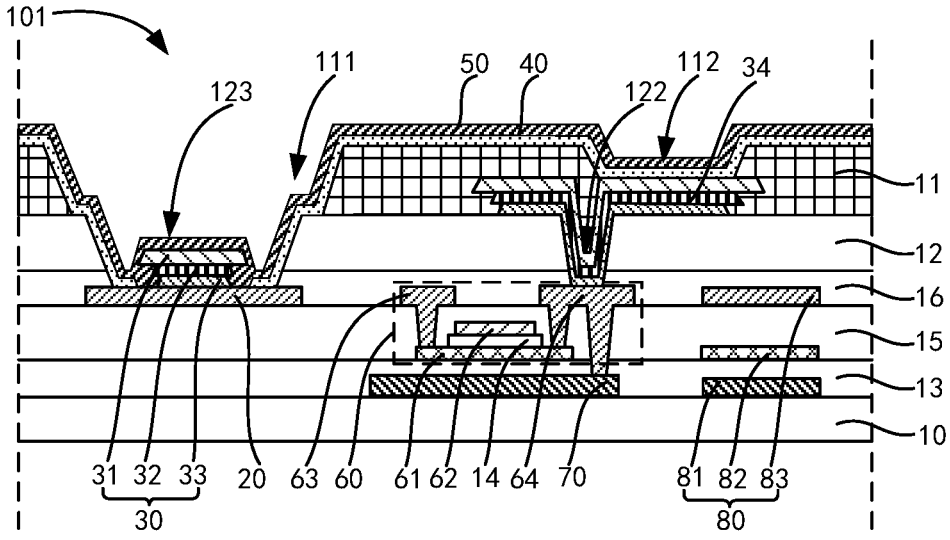
FIG. 3 is another cross-sectional schematic structural view of the display panel provided by the embodiment of the present application.

In an embodiment, with reference to FIGS. 1 to 3, FIG. 3 is another cross-sectional schematic structural view of the display panel provided by the embodiment of the present application. A difference from the above embodiment is that as shown in FIG. 3, in the display panel 101 of the present embodiment, a second aperture 123 is defined in a location of the planarization layer 12 corresponding to the first auxiliary electrode 20, the second aperture 123 is disposed to correspond to the first aperture 111 and communicates with the first aperture 111. The second aperture 123 exposes a portion of the first auxiliary electrode 20. The second auxiliary electrode 30 is located on the first auxiliary electrode 20 in the second aperture 123 and is electrically connected to the first auxiliary electrode 20.

In particular, with reference to FIG. 3, the second aperture 123 exposes the entire sidewall of the second auxiliary electrode 30. The cathode layer 50 directly contacts the entire sidewall of the second auxiliary electrode 30 and a portion of the first auxiliary electrode 20 to enlarge a direct contact area between the cathode layer 50 and the second auxiliary electrode 30 to further lower a contact resistance between the cathode layer 50 and the second auxiliary electrode 30 to further mitigate the uneven display resulting from the voltage drop.

Particularly, the orthographic projection of the second auxiliary electrode 30 on the underlay substrate 10 is separated from the orthographic projection of the pixel definition layer 11 on the underlay substrate 10 such that the second aperture 123 exposes the entire sidewall of the second auxiliary electrode 30. "Separated from" refers to that no overlap portion exists between two orthographic projections. In particular, no overlap portion exists between the orthographic projection of the second auxiliary electrode 30 on the underlay substrate 10 and the orthographic projection of the pixel definition layer 11 on the underlay substrate 10. Namely, the first aperture 111 of the pixel definition layer 11 exposes the entire second auxiliary electrode 30 such that the pixel definition layer 11 does not contact the second auxiliary electrode 30 to form an interval between the second auxiliary electrode 30 and the pixel definition layer 11. Existence of the interval exposes the entire sidewall of the second auxiliary electrode 30 such that the cathode layer 50 can directly contact the entire sidewall of the second auxiliary electrode 30.

It should be explained that the sidewall of the second auxiliary electrode 30 refers to an outer sidewall of the second auxiliary electrode 30 formed with the cutout structure 301. The sidewall faces the pixel definition layer 11, namely, a surface of the second auxiliary electrode 30 near the pixel definition layer 11. Other descriptions please refer to the above embodiments, and no repeated description is here.

Based on the same invention conception, the embodiment of the present application further provides a display panel manufacturing method, 請 with reference to FIGS. 1 to 8, FIG. 4 is a schematic flowchart of the display panel provided by the embodiment of the present application manufacturing method.

FIGS. 5 to 8 are schematic structural views of film layers of the display panel made from steps of a display panel manufacturing method provided by the embodiment of the present application. The present embodiment employs manufacturing the display panel 100 as an example for explanation, with reference to FIG. 4, the display panel manufacturing method comprises steps as follows:

A step S201 comprises: providing an underlay substrate 10, and manufacturing a first auxiliary electrode 20 on the underlay substrate 10.

Figure 5:
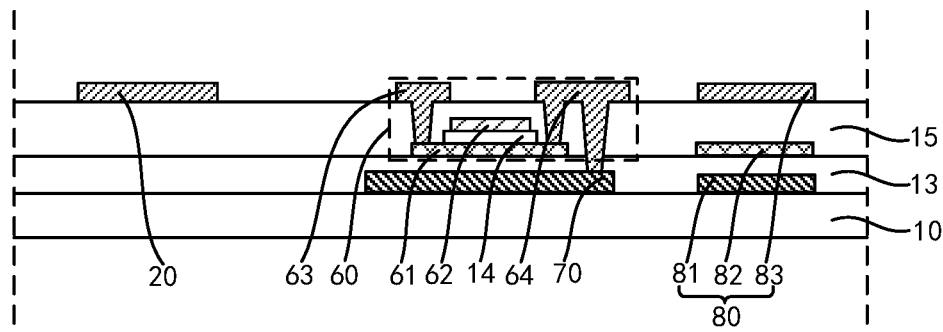
FIGS. 5 to 8 are schematic structural views of film layers of the display panel made from steps of a display panel manufacturing method provided by the embodiment of the present application.

In particular, with reference to FIG. 5, a light shielding layer 70 and a first electrode plate 81 of a storage capacitor 80 are manufactured on the underlay substrate 10. The light shielding layer 70 and the first electrode plate 81 are disposed in the same layer.

A transistor 60 is manufactured on the underlay substrate 10. Particularly, a buffer layer 13 is manufactured on the underlay substrate 10. The buffer layer 13 covers the light shielding layer 70, the first electrode plate 81, and the underlay substrate 10.

An active layer 61, a gate electrode insulation layer 14, a gate electrode 62, and an interlayer insulation layer 15 are sequentially manufactured and stacked on the buffer layer 13. A plurality of via holes are defined in the interlayer insulation layer 15. A second electrode plate 82 of the storage capacitor 80 is also formed during manufacturing the active layer 61. The second electrode plate 82 and the active layer 61 are disposed in the same layer.

A source electrode 63, a drain electrode 64, and a first auxiliary electrode 20 are manufactured on the interlayer insulation layer 15. The source electrode 63 is electrically connected to the active layer 61 via a first via hole of the interlayer insulation layer 15. The drain electrode 64 is electrically connected to the active layer 61 via a second via hole of the interlayer insulation layer 15. Also, the drain electrode 64 is electrically connected to the light shielding layer 70 via a third via hole of the interlayer insulation layer 15. During formation of the source electrode 63, the drain electrode 64, and the first auxiliary electrode 20, a third electrode plate 83 of the storage capacitor 80 is also formed.

A step S202 comprises: manufacturing a second auxiliary electrode 30 on a side of the first auxiliary electrode 20 away from the underlay substrate 10, wherein the second auxiliary electrode 30 is electrically connected to the first auxiliary electrode 20, the second auxiliary electrode 30 comprises a first electrode layer 31, a second electrode layer 32, and a third electrode layer 33 stacked on one another, the first electrode layer 31 is located on a side of the third electrode layer 33 away from the first auxiliary electrode 20 such that the edge of the second electrode layer 32 retracts relative to the edge of the first electrode layer 31 to form a cutout structure 301.

Figure 6:
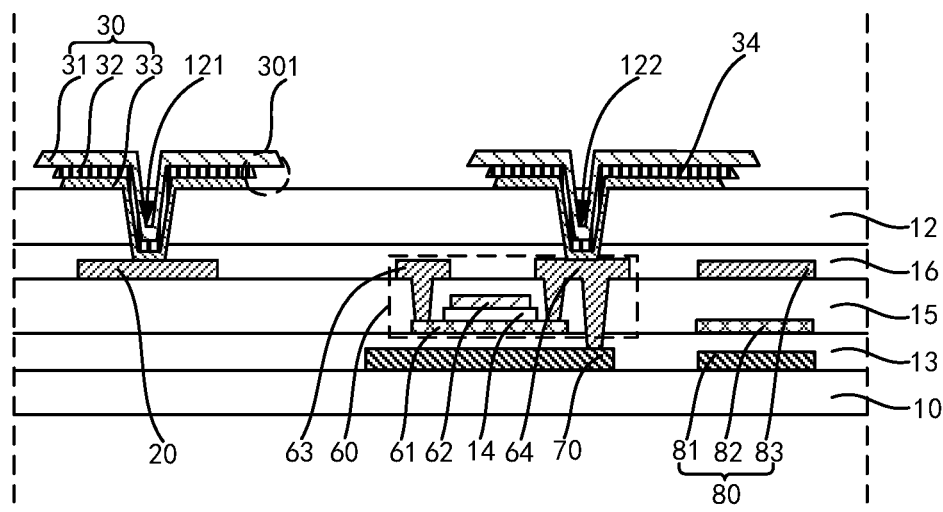

In particular, with reference to FIG. 6, a passivation layer 16 and a planarization layer 12 are sequentially manufactured and stacked on the side of the first auxiliary electrode 20 away from the underlay substrate 10. The passivation layer 16 covers the source electrode 63, the drain electrode 64. The first auxiliary electrode 20 and the interlayer insulation layer 15, the planarization layer 12 covers the passivation layer 16. A first via hole 121 and a second via hole 122 are defined in the planarization layer 12.

A second auxiliary electrode 30 and an anode 34 are manufactured on the planarization layer 12. The anode 34 is electrically connected to the drain electrode 64 via the second via hole 122a. The first auxiliary electrode 20 is electrically connected to the first auxiliary electrode 20 via the first via hole 121 to achieve electrical connection of the second auxiliary electrode 30 with the first auxiliary electrode 20.

The anode 34 and the second auxiliary electrode 30 are etched by the same etching process condition such that the edge of the second electrode layer 32 of the second auxiliary electrode 30 retracts relative to the edge of the first electrode layer 31 to form the cutout structure 301. Of course, because the anode 34 and the second auxiliary electrode 30 are formed under the same etching process condition, a cutout structure is also formed in the edge of the anode 34. As such, by using the same etching process condition, the second auxiliary electrode 30 and the anode 34 form the same cutout structure 301. Also, the cutout structure 301 is formed by a single etching process, which drastically simplifies processes and lowers the cost.

Particularly, etching the second auxiliary electrode 30 is used as an example for explanation, Ag acid is used to etch the second auxiliary electrode 30. An etching time of Ag acid and etching apparatus parameters are controlled such that the edge of the second electrode layer 32 retracts relative to the edge of the first electrode layer 31 to form cutout structure. For instance, when the etching time of Ag acid is shortened to 45 seconds, the second electrode layer 32 can retract relative to the first electrode layer 31 by 0.5 microns. Namely, controlling the etching time of Ag acid can control a depth by which the second electrode layer 32 retracts relative to the first electrode layer 31. Process parameters of the etching apparatus are improved, for instance, a spray pressure of a spray device in the etching apparatus is improved.

As such, by controlling an etching time of Ag acid and process parameters of the etching apparatus, the cutout structure can be formed on the second auxiliary electrode 30 by only a single etching process, which drastically improves a production rate.

A step S203 comprises: manufacturing a pixel definition layer 11 on a side of the second auxiliary electrode 30 away from the first auxiliary electrode 20, and defining a first aperture 111 in a location of the pixel definition layer 11 corresponding to the second auxiliary electrode 30, wherein the first aperture 111 exposes at least one portion of the cutout structure 301 of the second auxiliary electrode 30.

Figure 7:
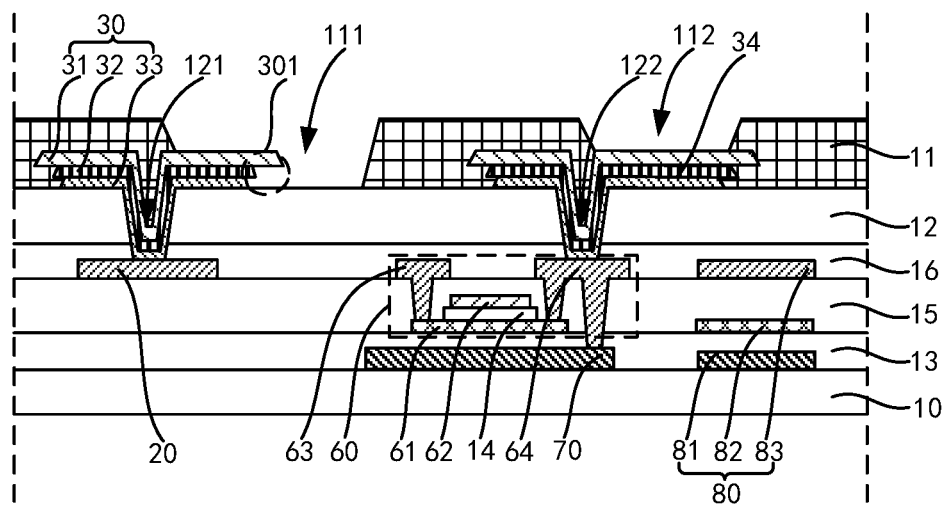

In particular, with reference to FIG. 7, a pixel definition layer 11 is manufactured on the planarization layer 12. A first aperture 111 is defined in a location of the pixel definition layer 11 corresponding to the second auxiliary electrode 30, and a third aperture 112 is defined in a location of the pixel definition layer 11 corresponding to the anode 34. The first aperture 111 exposes at least one portion of the cutout structure 301 of the second auxiliary electrode 30. The third aperture 112 partially exposes the anode 34, and the pixel definition layer 11 covers the edge of the anode 34.

A step S204 comprises: covering a side of the pixel definition layer 11 away from the second auxiliary electrode 30 with an organic light emitting layer 40, and disconnecting the organic light emitting layer 40 at the at least one portion of the cutout structure 301 of exposed by the first aperture 111 to expose at least one portion of a sidewall of the second auxiliary electrode 30.

Figure 8:
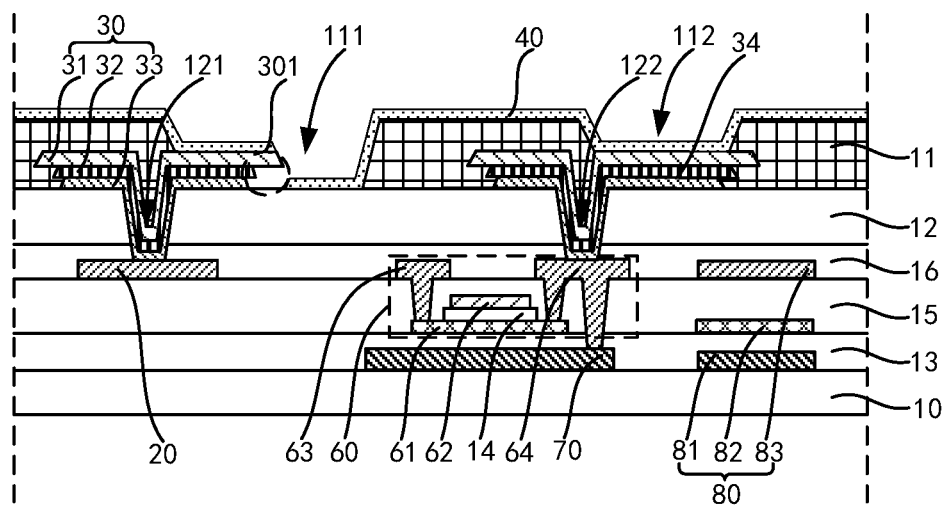

In particular, with reference to FIG. 8, an organic light emitting layer 40 is manufactured on a side of the pixel definition layer 11 away from the planarization layer 12 by an evaporation process. The organic light emitting layer 40 covers the pixel definition layer 11, the anode 34, and the second auxiliary electrode 30. However, because the cutout structure 301 exists on the edge of the second auxiliary electrode 30, the edge of the organic light emitting layer 40 is disconnected at the cutout structure 301 of the second auxiliary electrode 30. Namely, the organic light emitting layer 40 is disconnected at the at least one portion of the sidewall exposed by the first aperture 111 to expose the at least one portion of the sidewall.

A step S205 comprises: covering the organic light emitting layer 40 with a cathode layer 50 and electrically connecting the cathode layer 50 to at least one portion of a sidewall of the second auxiliary electrode 30 exposed by the organic light emitting layer 40.

In particular, with reference to FIG. 1, a cathode layer 50 is manufactured on the organic light emitting layer 40 by a sputtering process. The cathode layer 50 covers the organic light emitting layer 40 and covers the at least one portion of the sidewall of the second auxiliary electrode 30 exposed by the organic light emitting layer 40 to achieve directly contact of the cathode layer 50 with the second auxiliary electrode 30 to achieve electrical connection of the cathode layer 50 with the first auxiliary electrode 20.

It can be understood according to the above embodiment that:

The display panel and the display panel manufacturing method provided by the present application disposes a stacked second auxiliary electrode, and the second auxiliary electrode forms a cutout structure. A first aperture is defined in a location of the pixel definition layer corresponding to the second auxiliary electrode. The first aperture exposes at least one portion of the cutout structure of the second auxiliary electrode, the organic light emitting layer is disconnected at the at least one portion of the cutout structure exposed by the first aperture to expose at least one portion of the sidewall of the second auxiliary electrode. A cathode layer is electrically connected to the at least one portion of the sidewall of the second auxiliary electrode exposed by the organic light emitting layer such that the cathode layer can directly contact and be electrically connected to a sidewall of the second auxiliary electrode. The cathode layer can be bridged to the second auxiliary electrode without additionally disposing a spacer column to mitigate an IR-drop of the cathode layer, which solves an issue of a conventional OLED display panel required to manufacture a spacer column to mitigate the IR-drop of the metal cathode layer and resulting complicated processes.

In the above-mentioned embodiments, the descriptions of the various embodiments are focused. For the details of the embodiments not described, reference may be made to the related descriptions of the other embodiments.

The embodiments of the present application are described in detail as above. The principles and implementations of the present application are described in the following by using specific examples. The description of the above embodiments is only for assisting understanding of the technical solutions of the present application and the core ideas thereof. Those of ordinary skill in the art should understand that they can still modify the technical solutions described in the foregoing embodiments or equivalently replace some of the technical features. These modifications or replacements do not make the essence of the technical solutions depart from a range of the technical solutions of the embodiments of the present application.

What is claimed is:

1. A display panel, comprising:
an underlay substrate;
a first auxiliary electrode disposed on the underlay substrate;
a second auxiliary electrode disposed on a side of the first auxiliary electrode away from the underlay substrate and electrically connected to the first auxiliary electrode, wherein the second auxiliary electrode comprises a first electrode layer, a second electrode layer, and a third electrode layer stacked on one another, the first electrode layer is located on a side of the third electrode layer away from the first auxiliary electrode, an edge of the second electrode layer retracts relative to an edge of the first electrode layer to form a cutout structure;
a pixel definition layer disposed on a side of the second auxiliary electrode away from the first auxiliary electrode, wherein a first aperture is defined in a location of the pixel definition layer corresponding to the second auxiliary electrode, and the first aperture exposes at least one portion of the cutout structure of the second auxiliary electrode;
an organic light emitting layer covering a side of the pixel definition layer away from the second auxiliary electrode and disconnected on the at least one portion of the cutout structure exposed by the first aperture to expose at least one portion of a sidewall of the second auxiliary electrode; and
a cathode layer covering the organic light emitting layer and electrically connected to the at least one portion of the sidewall of the second auxiliary electrode exposed by the organic light emitting layer;
wherein a thickness of the first electrode layer is greater than a thickness of the third electrode layer, and the thickness of the first electrode layer ranges from 500 Å to 1000 Å.

2. The display panel according to claim 1, wherein material of the first electrode layer is the same as material of the third electrode layer, and the material of the first electrode layer is different from material of the second electrode layer.

3. The display panel according to claim 2, wherein the material of the first electrode layer comprises at least one of IZO, ITO, IGZO, and WOx, and the material of the second electrode layer comprises at least one of Ag alloy and Al alloy.

4. The display panel according to claim 1, further comprising a planarization layer covering the first auxiliary electrode and an anode disposed on the planarization layer, wherein the organic light emitting layer is located between the anode and the cathode layer, and the anode and the second auxiliary electrode are disposed in a same layer.

5. The display panel according to claim 4, wherein a first via hole is defined in a location of the planarization layer corresponding to the first auxiliary electrode location, the first via hole exposes a portion of the first auxiliary electrode, the second auxiliary electrode is located on the planarization layer and in the first via hole, and the second auxiliary electrode is electrically connected to the first auxiliary electrode via a portion of the second auxiliary electrode located in the first via hole.

6. The display panel according to claim 4, wherein a second aperture is defined in a location of the planarization layer corresponding to the first auxiliary electrode, the second aperture is disposed to correspond to the first aperture and communicates with the first aperture, the second aperture exposes a portion of the first auxiliary electrode; the second auxiliary electrode is located on the first auxiliary electrode in the second aperture, and is electrically connected to the first auxiliary electrode.

7. The display panel according to claim 4, further comprising a transistor disposed on the underlay substrate, wherein the anode is located on a side of the transistor away from the underlay substrate, and the anode is electrically connected to the transistor; the transistor comprises an active layer, a gate electrode, a source electrode, and a drain electrode, and the first auxiliary electrode and the source electrode are disposed in a same layer.

8. The display panel according to claim 1, wherein an edge of the third electrode layer retracts relative to the edge of the second electrode layer to form a second cutout structure.

9. A display panel, comprising:
an underlay substrate;
a first auxiliary electrode disposed on the underlay substrate;
a second auxiliary electrode disposed on a side of the first auxiliary electrode away from the underlay substrate and electrically connected to the first auxiliary electrode, wherein the second auxiliary electrode comprises a first electrode layer, a second electrode layer, and a third electrode layer stacked on one another, the first electrode layer is located on a side of the third electrode layer away from the first auxiliary electrode, an edge of the second electrode layer retracts relative to an edge of the first electrode layer to form a cutout structure;
a pixel definition layer disposed on a side of the second auxiliary electrode away from the first auxiliary electrode, wherein a first aperture is defined in a location of the pixel definition layer corresponding to the second auxiliary electrode, and the first aperture exposes at least one portion of the cutout structure of the second auxiliary electrode;
an organic light emitting layer covering a side of the pixel definition layer away from the second auxiliary electrode and disconnected on the at least one portion of the cutout structure exposed by the first aperture to expose at least one portion of a sidewall of the second auxiliary electrode;
a cathode layer covering the organic light emitting layer and electrically connected to the at least one portion of the sidewall of the second auxiliary electrode exposed by the organic light emitting layer; and a planarization layer covering the first auxiliary electrode and an anode disposed on the planarization layer, wherein the organic light emitting layer is located between the anode and the cathode layer, and the anode and the second auxiliary electrode are disposed in a same layer;

wherein an edge of the third electrode layer retracts relative to the edge of the second electrode layer to form a second cutout structure;

wherein a second aperture is defined in a location of the planarization layer corresponding to the first auxiliary electrode, the second aperture is disposed to correspond to the first aperture and communicates with the first aperture, the second aperture exposes a portion of the first auxiliary electrode; the second auxiliary electrode is located on the first auxiliary electrode in the second aperture, and is electrically connected to the first auxiliary electrode.

10. The display panel according to claim 9, wherein a thickness of the first electrode layer is greater than a thickness of the third electrode layer, and the thickness of the first electrode layer ranges from 500 Å to 1000 Å.

11. The display panel according to claim 9, wherein material of the first electrode layer is the same as material of the third electrode layer, and the material of the first electrode layer is different from material of the second electrode layer.

12. The display panel according to claim 11, wherein the material of the first electrode layer comprises at least one of IZO, ITO, IGZO, and WOx, and the material of the second electrode layer comprises at least one of Ag alloy and Al alloy.

13. The display panel according to claim 9, wherein a first via hole is defined in a location of the planarization layer corresponding to the first auxiliary electrode location, the first via hole exposes a portion of the first auxiliary electrode, the second auxiliary electrode is located on the planarization layer and in the first via hole, and the second auxiliary electrode is electrically connected to the first auxiliary electrode via a portion of the second auxiliary electrode located in the first via hole.

14. The display panel according to claim 9, further comprising a transistor disposed on the underlay substrate, wherein the anode is located on a side of the transistor away from the underlay substrate, and the anode is electrically connected to the transistor; the transistor comprises an active layer, a gate electrode, a source electrode, and a drain electrode, and the first auxiliary electrode and the source electrode are disposed in a same layer.

15. A display panel manufacturing method, comprising:
providing an underlay substrate, and manufacturing a first auxiliary electrode on the underlay substrate;
manufacturing a second auxiliary electrode on a side of the first auxiliary electrode away from the underlay substrate, wherein the second auxiliary electrode is electrically connected to the first auxiliary electrode, the second auxiliary electrode comprises a first electrode layer, a second electrode layer, and a third electrode layer stacked on one another, the first electrode layer is located on a side of the third electrode layer away from the first auxiliary electrode, and making an edge of the second electrode layer retracting relative to an edge of the first electrode layer to form a cutout structure;

manufacturing a pixel definition layer on a side of the second auxiliary electrode away from the first auxiliary electrode, and forming a first aperture in a location of the pixel definition layer corresponding to the second auxiliary electrode, wherein the first aperture exposes at least one portion of the cutout structure of the second auxiliary electrode;

covering a side of the pixel definition layer away from the second auxiliary electrode with an organic light emitting layer, and disconnecting the organic light emitting layer at the at least one portion of the cutout structure exposed by the first aperture to expose at least one portion of a sidewall of the second auxiliary electrode; and covering the organic light emitting layer with a cathode layer, and electrically connecting the cathode layer to the at least one portion of the sidewall of the second auxiliary electrode exposed by the organic light emitting layer;

wherein a thickness of the first electrode layer is greater than a thickness of the third electrode layer, and the thickness of the first electrode layer ranges from 500 Å to 1000 Å.

16. The display panel manufacturing method according to claim 15, wherein the step of making an edge of the second electrode layer retracting relative to an edge of the first electrode layer to form a cutout structure comprises:
etching the second auxiliary electrode by Ag acid, by controlling an etching time and an etching apparatus parameter of the Ag acid, and making an edge of the second electrode layer retract relative to an edge of the first electrode layer to form a cutout structure.

17. The display panel manufacturing method according to claim 15, wherein the step of manufacturing a second auxiliary electrode on a side of the first auxiliary electrode away from the underlay substrate further comprises: making an edge of the third electrode layer retract relative to the edge of the second electrode layer to form a second cutout structure.

18. The display panel manufacturing method according to claim 16, wherein the step of manufacturing a second auxiliary electrode on a side of the first auxiliary electrode away from the underlay substrate further comprises: making an edge of the third electrode layer retract relative to the edge of the second electrode layer to form a second cutout structure.

* * * * *